(12) United States Patent
Kalb et al.

(10) Patent No.: US 8,184,469 B2
(45) Date of Patent: May 22, 2012

(54) STORED MULTI-BIT DATA CHARACTERIZED BY MULTIPLE-DIMENSIONAL MEMORY STATES

(75) Inventors: Johannes A. Kalb, San Jose, CA (US); DerChang Kau, Cupertino, CA (US); Gianpaolo Spadini, Campbell, CA (US)

(73) Assignee: Micron Technology, Inc., Boise, ID (US)

( * ) Notice: Subject to any disclaimer, the term of this patent is extended or adjusted under 35 U.S.C. 154(b) by 88 days.

(21) Appl. No.: 12/627,234

(22) Filed: Nov. 30, 2009

(65) Prior Publication Data

US 2011/0128770 A1 Jun. 2, 2011

(51) Int. Cl.
*G11C 11/00* (2006.01)

(52) U.S. Cl. ........................................ 365/148; 365/163
(58) Field of Classification Search .................. 365/148, 365/163
See application file for complete search history.

(56) References Cited

U.S. PATENT DOCUMENTS

| | | | |
|---|---|---|---|
| 6,473,332 B1 * | 10/2002 | Ignatiev et al. | 365/148 |
| 6,639,825 B2 * | 10/2003 | Feurle et al. | 365/149 |

* cited by examiner

*Primary Examiner* — Huan Hoang
(74) *Attorney, Agent, or Firm* — Berkeley Law & Technology Group, LLP

(57) ABSTRACT

A method for enhancing data storage may comprise storing two or more bits in a memory cell, wherein the stored bits may be characterized by two or more independent variables based, at least in part, on physical properties of the memory cell.

16 Claims, 7 Drawing Sheets

STORED MULTI-BIT DATA CHARACTERIZED BY MULTIPLE-DIMENSIONAL MEMORY STATES

BACKGROUND

1. Field

Subject matter disclosed herein relates to enhancing data storage density of a memory device.

2. Information

Phase change memories (PCM) and resistive random access memories (RRAM), for example, generally store data by placing a memory cell in either of two physical states representing "1" or "0". One such state may be distinguished from the other state, such as during a read process, for example, if electrical resistance of each state is different. Such a process of storing data may enable the storage of one bit per memory cell, for example. Increasing density of such data storage to greater than one bit per memory cell may lead to a number of advantages such as reduced memory fabrication costs and/or smaller memory devices, just to name a few examples.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
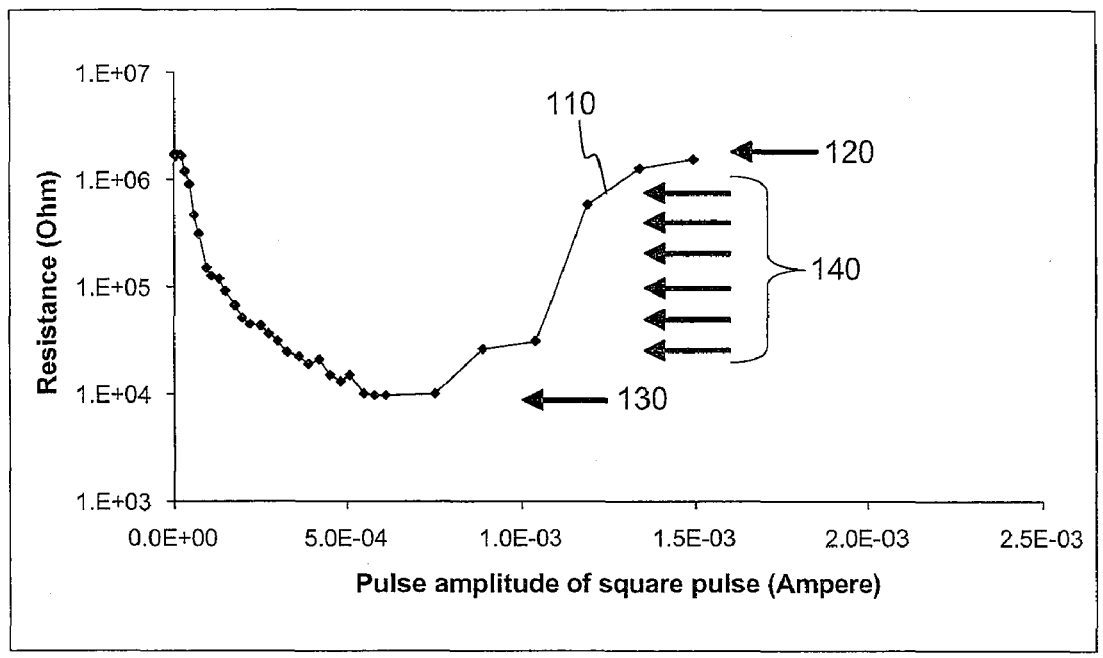
FIG. 1 shows a plot of values of resistance of a memory cell versus a function of pulse amplitude, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, data comprising more than one bit may be stored in a memory cell by representing such data by a memory cell state that is characterized by multiple state variables that are independent of one another. For example, a first state variable that is independent of a second state variable may mean that the first state variable may be changed or altered without substantially affecting the second state variable, and vise versa. In another example, a resistance of a memory cell (a first state variable) measured at a relatively low voltage may be independent of a threshold voltage (a second state variable) of the same memory cell.

Such a memory cell may comprise a portion of a phase change memory (PCM), a resistive random access memory (RRAM), or other such resistance change memory, just to name a few examples. Here, a memory cell may comprise the smallest addressable unit of a memory device. For example, a PCM memory cell, which may be identified by a unique address among a plurality of other memory cells in a memory device, may comprise top and bottom electrodes, a heater, and a phase change material. In another example, a memory cell may comprise an addressable portion of memory that stores as few as one bit of information. In one implementation, an individual memory cell may contain a spatially continuous and programmable volume element composed of a resistance change material in which data is stored. Memory cell states may be established by a write operation and/or detected by a read operation applied to the memory cell. Such a memory cell state or state variable may be based, at least in part, on physical properties of a memory cell. A memory cell state or state variable may be time-independent or time-dependent, wherein, for example, time dependency may result from a structural or physical change of the memory cell over time. For a state variable, time dependence of such a structural change need not depend on a method used to program (write to) a memory cell. Storing data represented by a memory cell state characterized by multiple independent state variables may provide benefits such as reducing fabrication cost per megabyte of memory by increasing data storage density for memory devices. Of course, such a benefit and details of storing data as described above are merely example benefits, and claimed subject matter is not so limited.

In an embodiment, the state of a memory cell may be characterized by multiple independent state variables: $x_1(t)$, $x_2(t)$, $x_3(t)$, $x_4(t)$, … $x_n(t)$, wherein n is an integer. A state of the memory cell may then be described by an n-dimensional state function, namely $\zeta(t)=\zeta(x_1(t), x_2(t), x_3(t), x_4(t), \ldots x_n(t))$. Such n state variables may be adjusted or tuned independently of one another. For example, data stored in a memory cell may be characterized by a first state variable that is selected to comprise a particular value. Data stored in the memory cell may also be characterized by a second state variable that is selected and/or adjusted independently of the first state variable. Accordingly, such a characterization of a memory cell may allow the memory cell to store data, such as multi-bit data, at a relatively high density compared to a memory cell that stores data merely characterized by a single state variable. In particular, use of such an n-dimensional memory cell state may lead to increased data storage density for a given cell size and/or lithography node, thereby reducing manufacturing cost per megabyte of memory, for example.

FIG. 1 shows values of resistance 110 of a resistive memory cell plotted against pulse amplitude of a square write pulse applied to the memory cell, according to an embodiment. Data stored in such a memory cell may be characterized by one state variable comprising intermediate resistance states (multi-level storage). For example, in PCM, data storage density may be increased by programming a cell to a partially amorphous (or partially crystalline) state using a suitable write pulse amplitude. For individual data points, a memory cell may be pre-conditioned to a "fully" amorphous (high resistance) state 120. Such a memory cell may also be in a fully crystalline (low resistance) state 130. In this fashion, a continuous spectrum of intermediate resistance states may be obtained. However, under practical conditions, only a relatively small discrete number of states 140 may be implemented due to difficulties in distinguishing among multiple states, wherein detecting such states may involve measuring relatively small differences of current and/or voltage among the memory cells. To illustrate an example, storing three data bits per cell may involve eight discrete resistance levels 120, 130, and combined six levels 140, though claimed subject matter is not so limited.

To describe aspects of FIG. 1 mathematically, a state of a resistive memory cell may be characterized by a 1-dimensional state function $\zeta$. In other words, a state of the memory cell may be identified by a single state parameter (or state variable), which may comprise electrical resistance $\rho_{low}$ measured at a relatively low electric field or low voltage (non-destructive read). Accordingly, the state function may take the general form $\zeta=\zeta(\rho_{low})$. The subscript "low" in $\rho_{low}$, emphasizes that resistance may be measured under a relatively low electric field (or voltage) to avoid a permanent change in the state of the memory cell (non-destructive read). To illustrate a particular example, before applying individual program pulses, a memory cell may be initially set to a fully amorphous/high resistance state using a square pulse of 1.58 mA amplitude. Of course, such details of a programming pulse are merely examples, and claimed subject matter is not so limited.

As described above, the state of a memory cell may be characterized by multiple independent state variables: $x_1, x_2, x_3, x_4, \ldots x_n$, wherein n is an integer (the time variable t is not explicitly shown, though it should be understood that such state variables may be time-dependent). $N_i$ may represent a number of states that an individual state variable $x_i$ may comprise under practical circumstances (e.g., considering physical constraints involved in measuring such states).

A maximum number $N_{max}$ of available memory states represented by the multi-dimensional state function $\zeta$ may then be expressed as a product of available states per state variable $N_i$.

$$N_{max} = N_1 \times N_2 \times N_3 \times \ldots \times N_n = \prod_{i=1}^{n} N_i.$$

The total number of states N may then be expressed as $2 \leq N \leq N_{max}$.

Accordingly, characterizing stored data using multi-dimensional states, rather than using single dimensional states, may provide a relatively large number of available states to define data values.

To illustrate a particular example, applying expressions introduced above for n=2, a state function may be written as $\zeta=\zeta(x_1, x_2)$, where $x_1=\rho_{low}$, and $x_2=V_{th}$. In other words, adding to state variable $x_1=\rho_{low}$, described above is a second state variable $x_2=V_{th}$. Such state variables may be independent of one another. State variable $x_1=\rho_{low}$ may comprise memory cell resistance measurable at a relatively low electric field (or voltage) while $x_2=V_{th}$ may comprise a threshold voltage measurable at a relatively high electric field (or voltage), which will be explained in detail below.

Figure 2:
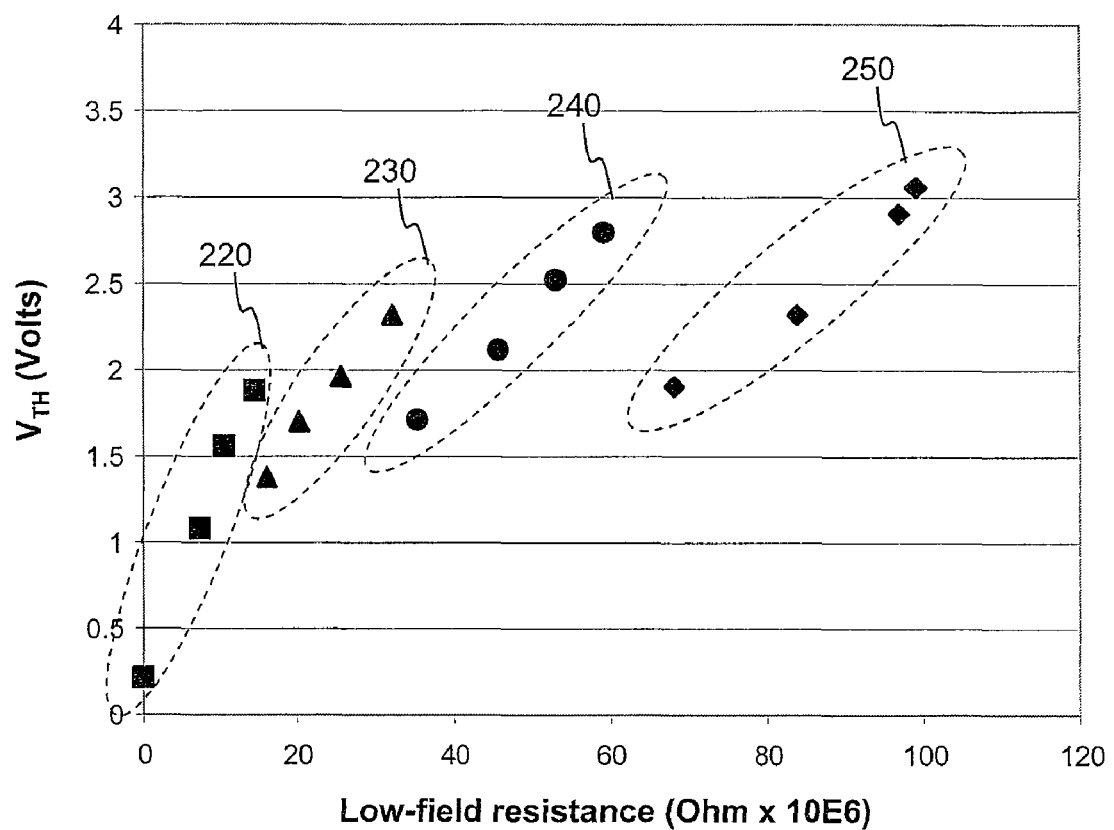
FIG. 2 shows a plot of values of threshold voltage and low-field resistance of a memory cell, according to an embodiment.

FIG. 2 shows a plot 200 of values of state variables $V_{th}$ and $\rho_{low}$, written to, and stored, in a memory cell, such as for a PCM memory cell, according to an embodiment. Data bits represented by such state variable values may be written to a memory cell by applying an electrical program pulse comprising a particular pulse amplitude and pulse shape corresponding to particular data bits. In an implementation, for example, pulse amplitude and pulse shape of a program pulse may be adjusted to particular values in order to select a particular low field state variable $\rho_{low}$, and a high field state variable $V_{th}$ independently of one another. The term "field" refers to an electric field or voltage applied during a read process. In a particular example, $\rho_{low}$ measured at a relatively low voltage (e.g., 20 mV) may be chosen as a low field state variable, and threshold voltage $V_{th}$ of the cell may be chosen as a high field state variable. Accordingly, a corresponding state function may be written as $\zeta=\zeta(\rho_{low}, V_{th})$.

In FIG. 2, to illustrate a particular example, a program pulse having an amplitude of 1.64 mA may be used to establish memory cell states 220, a program pulse having an amplitude of 1.73 mA may be used to establish memory cell states 230, a program pulse having an amplitude of 1.81 mA may be used to establish memory cell states 240, and a program pulse having an amplitude of 1.89 mA may be used to establish memory cell states 250, though claimed subject matter is not so limited. Variation of values within memory cell states 220, 230, 240, and 250 may be established by varying the shape of a program pulse. Such a pulse shape may comprise a trailing edge defined as a time span from peak amplitude to substantially zero amplitude (pulse decay) of a pulse. The lowest value of each set of memory cell states 220, 230, 240, and 250 may be established using a program pulse having a trailing edge of 185 nanoseconds (ns), whereas the next higher value may be established using a program pulse having a trailing edge of 125 ns, and the next higher value may be established using a program pulse having a trailing edge of 65 ns. Finally, the highest value of each set of memory cell states 220, 230, 240, and 250 may be established using a program pulse having a trailing edge of 5.0 ns. Accordingly, particular characteristics of a program pulse, such as amplitude and/or trailing edge, may be used to establish particular state values. In other words, amplitude and/or trailing edge of a program pulse may be adjusted in order to program a memory cell to store a particular data value characterized by a corresponding memory cell state. For example, plot 200 shows sixteen distinct states wherein such states may be used to store sixteen distinct data values. As an illustrative example, a data value represented by bits 1101 may be defined to correspond to a memory state having a threshold voltage of 2.0 volts and low-field resistance of 28.0 million ohms. Furthermore, such a memory state may be established for a memory cell by applying a write pulse having a peak amplitude of 1.73 mA and a trailing edge of 65 ns. In addition, amplitude and/or trailing edge of a program pulse may be adjusted in infinitesimally small steps (not shown) so that substantially any state point within the 2-dimensional $\rho_{low}$ times $V_{th}$ state space may be accessed. Accordingly, many more state values than the plotted sixteen values shown may be used to store a relatively large quantity of data in a memory cell, thus increasing data storage density. Of course, such details of storing data characterized by state variables are merely examples, and claimed subject matter is not so limited.

Figure 3:
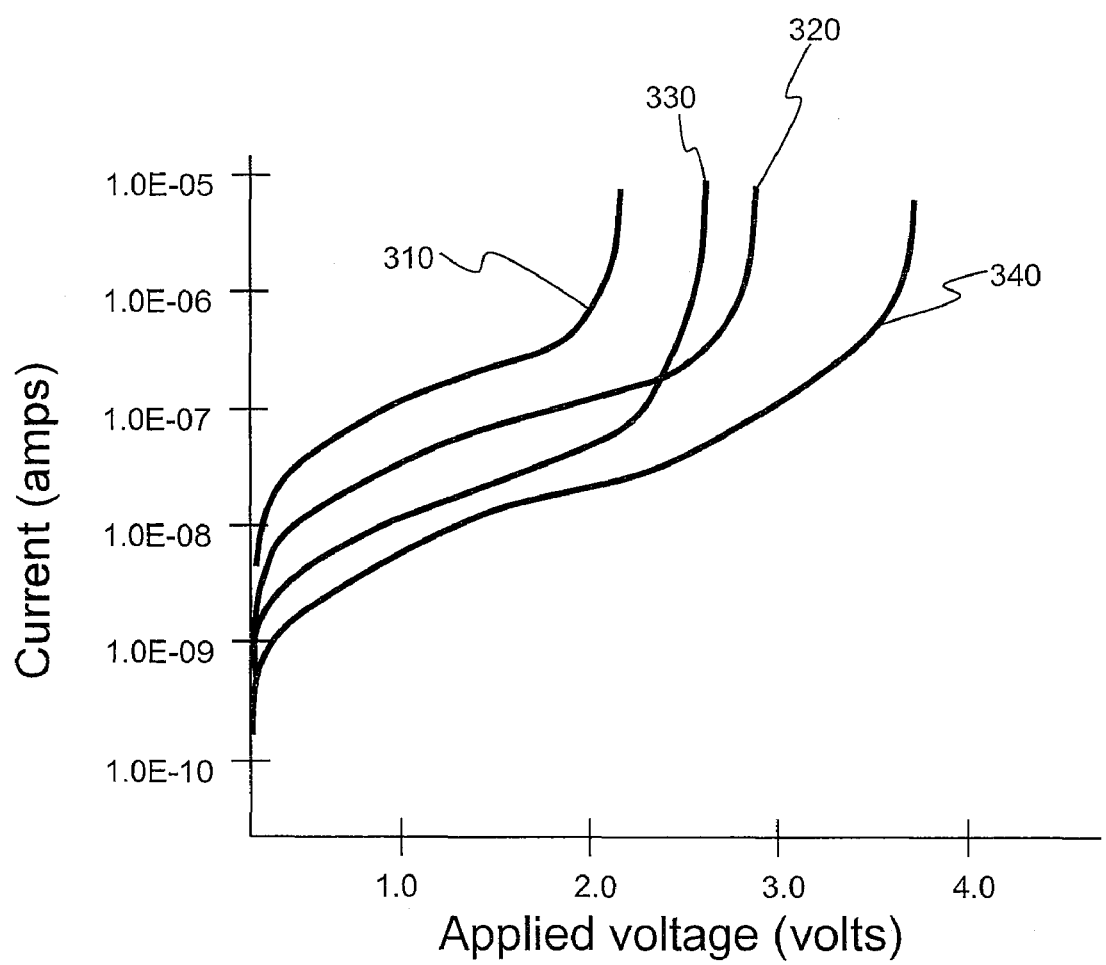
FIG. 3 shows a plot of current versus voltage applied to a memory cell, according to an embodiment.
Figure 4:
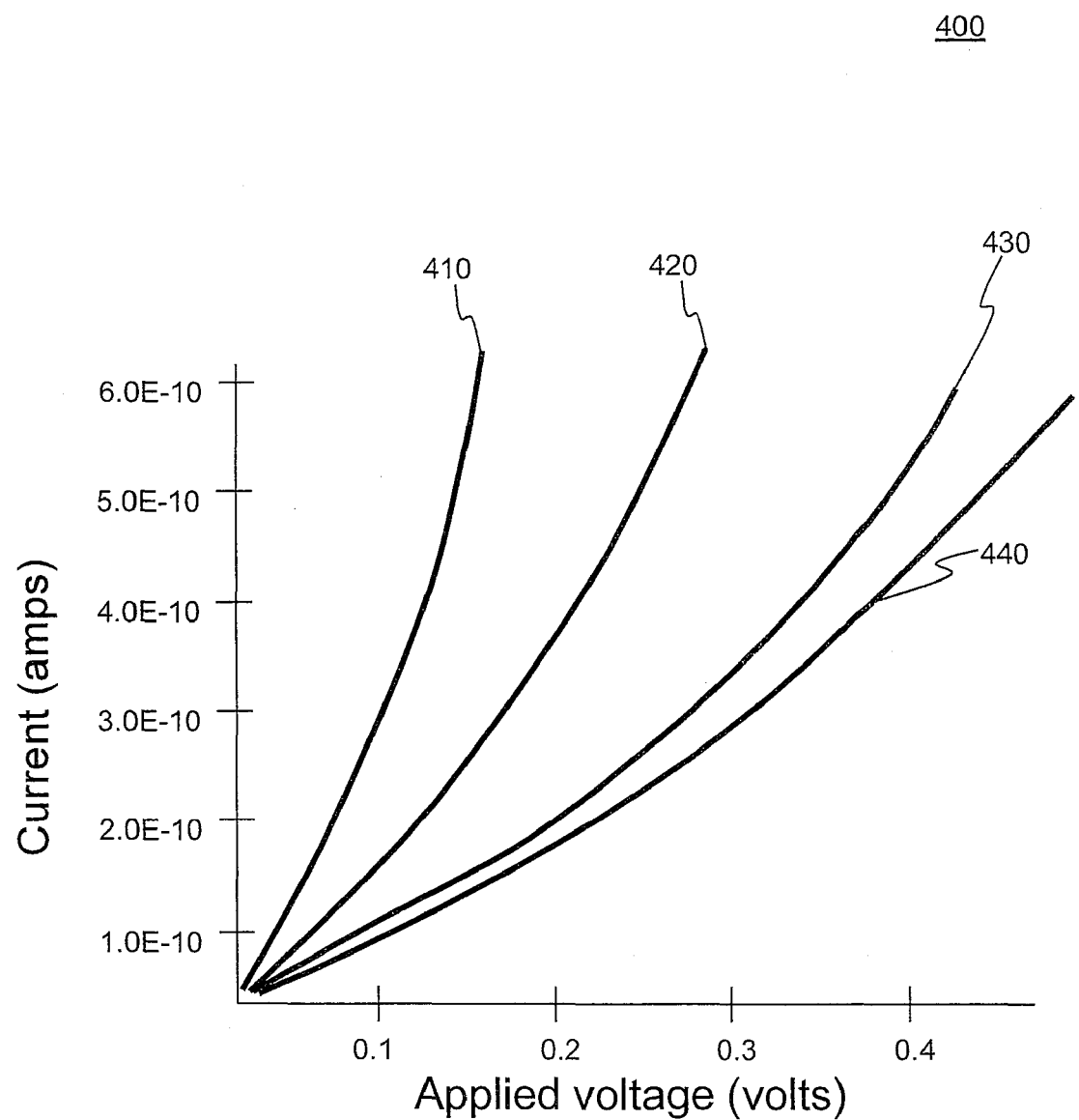
FIG. 4 shows a plot of current versus voltage applied to a memory cell, according to another embodiment.

In another embodiment, the resistance of a memory cell, $\rho_{low}$, measured at a relatively low voltage may be chosen as a low-field state variable, and the resistance of a memory cell, $\rho_{high}$, measured at a relatively high voltage may be chosen as a high-field state variable. Accordingly, a corresponding state function may be written as $\zeta=\zeta(\rho_{low}, \rho_{high})$. Variables $\rho_{low}$, $\rho_{high}$ may be independent of one another, for example, due to non-linearity of a current-voltage relation for a memory cell. Such a relation is shown in FIGS. 3 and 4, which shows a plot of memory cell current versus voltage applied to the memory cell, according to an embodiment. Accordingly, such a state function comprising $\rho_{low}$ and $\rho_{high}$ may be useful for memory that, due to particular materials and/or design, is not able to be characterized by a threshold voltage, such as RRAM for example.

In FIGS. 3 and 4, plots 300 and 400 comprise plots of sub-threshold current-voltage relations for various program pulse current amplitudes and trailing edge values for a memory cell. In particular, plot 300 shows a high-field regime, whereas plot 400 shows a magnified portion of plot 300 in a low-field regime. To illustrate a particular example, plots 310 and 410 correspond to a program pulse current amplitude of 1.73 mA and a trailing edge of 185 ns, plots 320 and 420 correspond to a program pulse current amplitude of 1.73 mA and a trailing edge of 5.0 ns, plots 330 and 430 correspond to a program pulse current amplitude of 1.89 mA and a trailing edge of 185 ns, and plots 340 and 440 correspond to a program pulse current amplitude of 1.89 mA and a trailing edge of 5.0 ns. Plot 300 illustrates that a high-field state variable may be represented either by a threshold voltage $V_{th}$, as described above, or by a high-field (high-voltage) resistance. However, plot 400 shows that a current-voltage relationship may be substantially linear in a low-field regime. Accordingly, $\rho_{low}$ and $\rho_{high}$ may not be independent state variables if they were defined and measured at relatively low voltages, such as 20 millivolts (mV) or 200 mV, where a current-voltage relationship may be linear. On the other hand, resistance measured at two sufficiently different voltages, such as 20 mV and 2000 mV may be independent state variables due to non-linearity of a current-voltage relationship over such a large voltage range.

Figure 5:
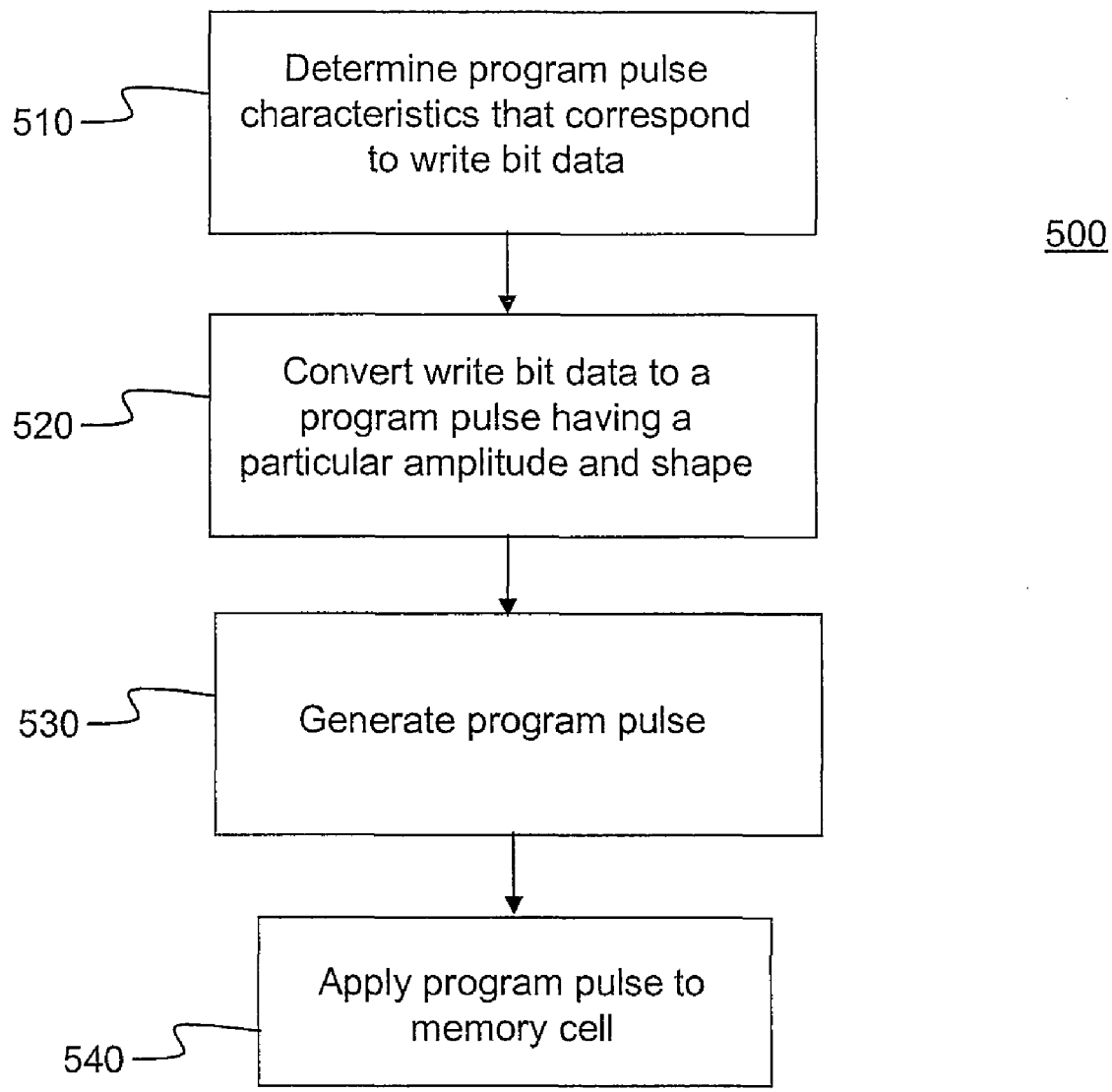
FIG. 5 is a flow diagram of a write process for a memory cell, according to an embodiment.

FIG. 5 is a flow diagram of a write process 500 for a memory cell, according to an embodiment. At block 510, a memory controller, for example, may determine particular characteristics of a program pulse that correspond to write bit data to be written to a memory cell. Such characteristics may comprise peak pulse amplitude and/or pulse shape, which may include a pulse trailing edge, as discussed above. For example, write bit data may comprise a sequence of four bit words, such as 1011, 1010, 0101, and so on. In an implementation, such four bit words may individually correspond to a particular memory cell state represented by two independent state variables such as resistance and threshold voltage, for example. Individual memory states, such as those shown in FIG. 2, for example, may be established in a memory cell by applying particular write pulse amplitude and/or shape. Accordingly, at block 520, write bit data may be converted to corresponding program pulses. At block 530, such program pulses may be generated and applied to respective memory cells, such as at block 540, for example. Thus, individual memory cells may store multi-bit data by applying a single program pulse. Of course, details of such a write process 500 are merely examples, and claimed subject matter is not so limited. For example, a memory state may be represented by two or more state variables, and multi-bit data may comprise substantially any number of bits.

Figure 6:
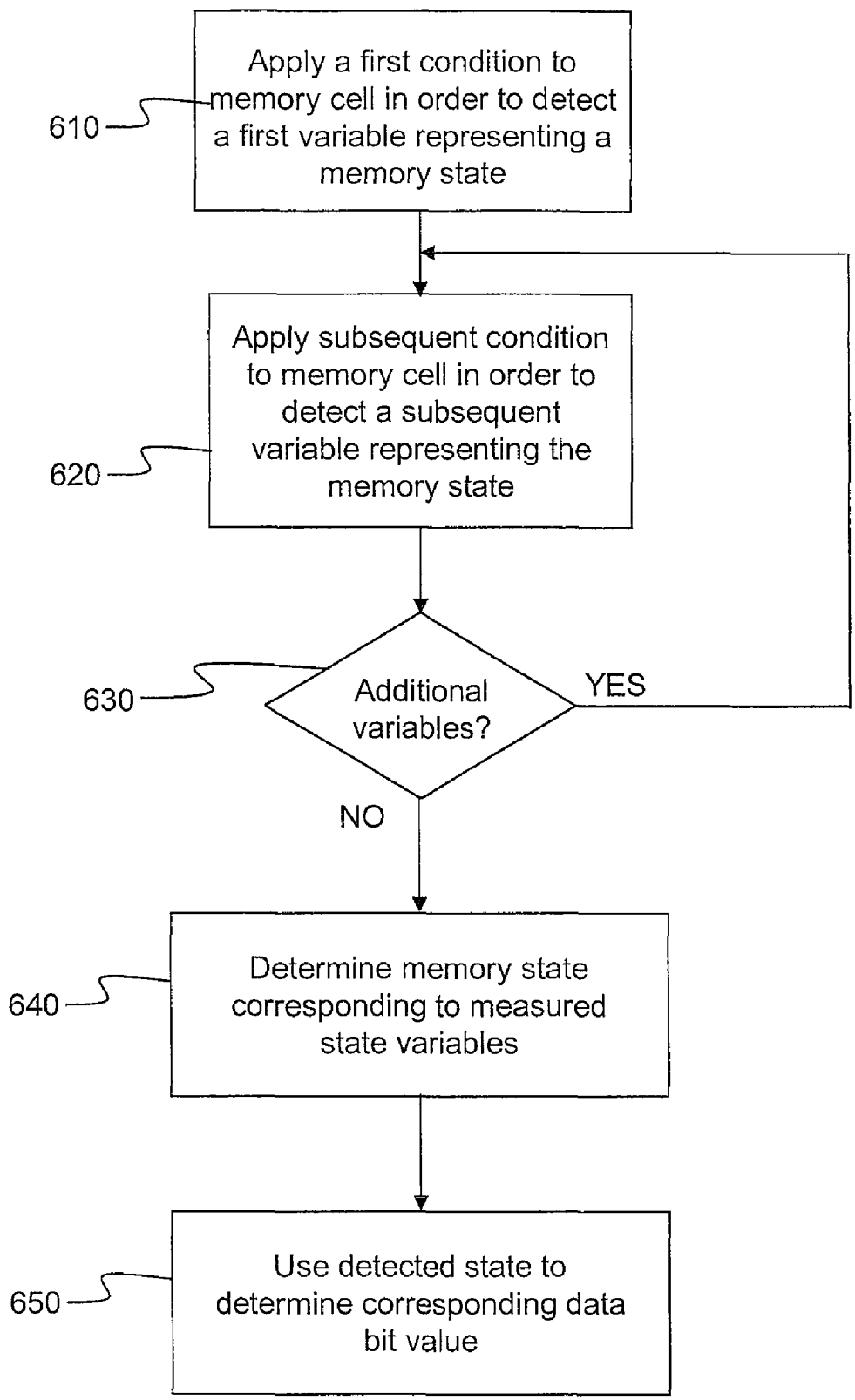
FIG. 6 is a flow diagram of a read process for a memory cell, according to an embodiment.

FIG. 6 is a flow diagram of a read process 600 for a memory cell, according to an embodiment. At block 610, a first condition may be applied to a memory cell in order to measure a first variable that represents a memory state corresponding to a stored multi-bit data value. For example, such a memory state may comprise a memory state among the sixteen memory states shown in FIG. 2. In a particular implementation, a first condition may comprise a relatively low electric field (or low voltage) that does not alter the state of the memory cell (non-destructive read). Such a first condition may be used to measure a low-field state variable comprising a low-field resistance $\rho_{low}$, for example. Electrical current resulting from applying a low electric field may be measured to provide a value for $\rho_{low}$.

At block 620, a second condition may be applied to a memory cell in order to measure a second variable. For example, such a second condition may comprise a relatively high electric field (or high voltage). Such a second condition may be used to measure a high field state variable comprising threshold voltage $V_{th}$, for example. In a particular implementation, applied voltage may be increased in relatively small steps until a threshold event is detected. For example, a threshold event may occur if memory cell current increases towards or beyond a value of threshold current associated with material used to fabricate the memory cell. First and/or subsequent steps of such a measurement process may not yield a measurement of $V_{th}$: applied voltage may be increased by further steps until a threshold event is detected, which may yield a measurement of $V_{th}$, which may comprise the second state of the memory cell. For example, for a particular memory cell, an applied voltage of 0.6V yields a measured current that is substantially below a threshold current $I_{th}$: accordingly, $V_{th}$ may be higher than 0.6V. Therefore, applied voltage may be increased to a next level, say 0.7V (assuming a step size of 0.1V). Current may then be measured again and compared to $I_{th}$. Applied voltage may be increased further until $V_{th}$ is detected, which may be the case once measured current is close to (or higher) than $I_{th}$, for example. Of course, details of such an approach to measuring state variables of a memory cell are merely examples, and claimed subject matter is not so limited.

At diamond 630, a determination may be made whether a memory cell involves additional state variables that are to be measured in order to determine a memory state. If so, process 600 may return to block 620 in order to measure such additional state variables. Otherwise, process 600 may proceed to block 640 where a memory state may be determined based, at least in part, on two or more measured state variables. At block 650, a multi-bit data value corresponding to such a memory state may be determined. Accordingly, in summary, a memory cell may store such multi-bit data by representing such data by a particular multi-dimensional memory state. Thus, reading such a memory cell may yield stored multi-bit data after determining multi-bit data that corresponds to a particular memory state. Of course, such processes applied to a memory cell or other component of memory are merely examples, and claimed subject matter is not so limited.

Figure 7:
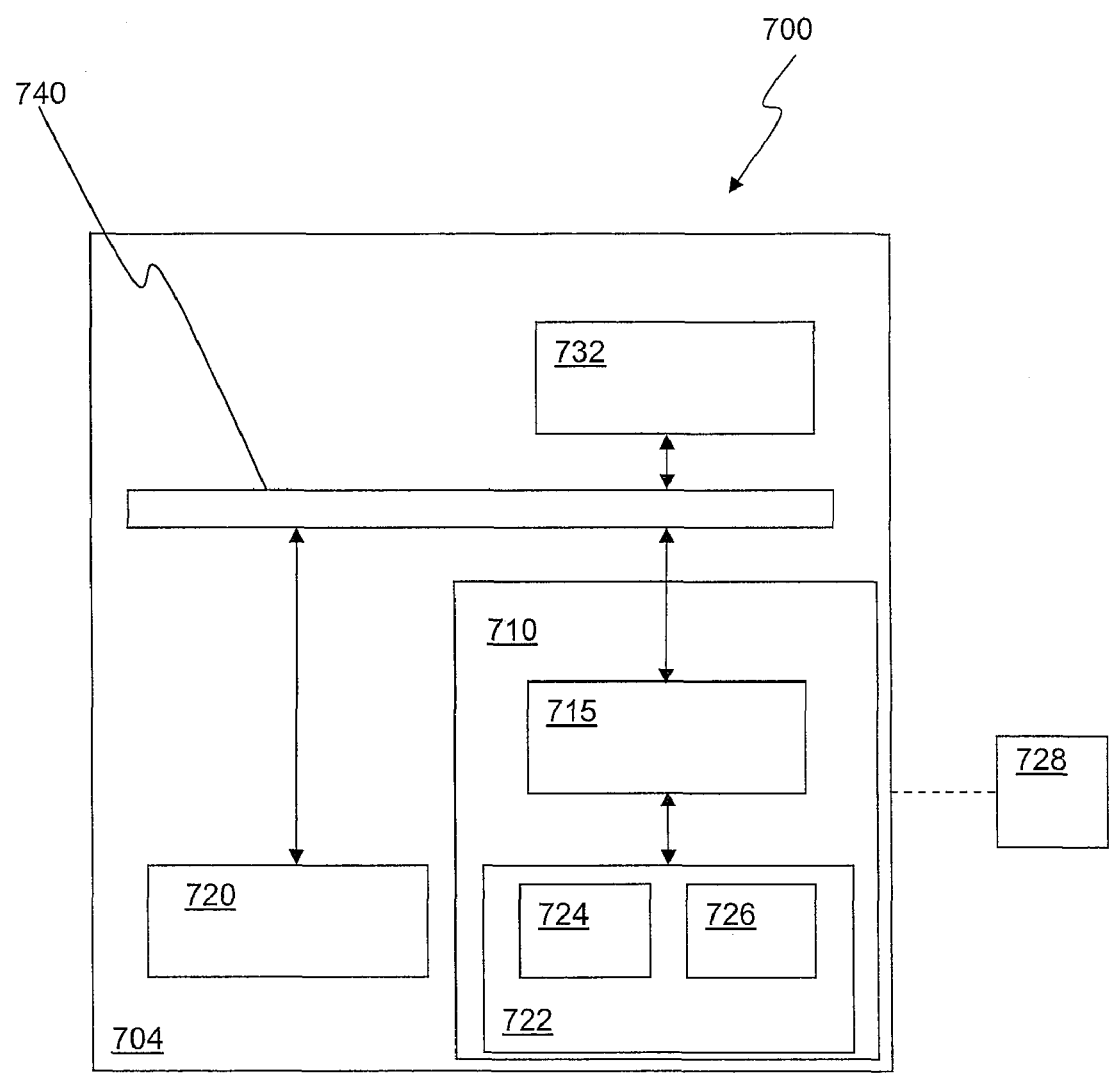
FIG. 7 is a schematic diagram illustrating an exemplary embodiment of a computing system.

FIG. 7 is a schematic diagram illustrating an exemplary embodiment of a computing system 700 including a memory device 710 that may comprise an array of memory cells described above, for example. A computing device 704 may be representative of any device, appliance, and/or machine that may be configurable to manage memory device 710. Memory device 710 may include a memory controller 715 and a memory 722. By way of example but not limitation, computing device 704 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 700, and processes and methods described herein, may be implemented using or otherwise including hardware, firmware, software, or any combination thereof. Thus, by way of example but not limitation, computing device 704 may include at least one processing unit 720 that is operatively coupled to memory 722 through a bus 740 and a host or memory controller 715. Processing unit 720 is representative of one or more circuits configurable to perform at least a portion of a data computing procedure or process, such as applying at least a portion of process 500 described above, for example. By way of example but not limitation, processing unit 720 may include one or more processors, controllers, microprocessors, microcontrollers, application specific integrated circuits, digital signal processors, programmable logic devices, field programmable gate arrays, and the like, or any combination thereof. Processing unit 720 may communicate with memory controller 715 to process and/or initiate memory-related operations, such as read, write, and/or erase. For example, processing unit 720 may instruct memory controller 715 to apply a program pulse to one or more particular memory cells in memory device 710. Processing unit 720 may include an operating system configured to communicate with memory controller 715. Such an operating system may, for example, generate commands to be sent to memory controller 715 over bus 740. Such commands may include instructions to read data values stored in memory cells using a process such as process 600 described above in FIG. 6, for example.

Memory 722 is representative of any data storage mechanism. Memory 722 may include, for example, a primary memory 724 and/or a secondary memory 726. Primary memory 724 may include, for example, a random access memory, read only memory, etc. While illustrated in this example as being separate from processing unit 720, it should be understood that all or part of primary memory 724 may be provided within or otherwise co-located/coupled with processing unit 720.

Secondary memory 726 may include, for example, the same or similar type of memory as primary memory and/or one or more data storage devices or systems, such as, for example, a disk drive, an optical disc drive, a tape drive, a solid state memory drive, etc. In certain implementations, secondary memory 726 may be operatively receptive of, or otherwise configurable to couple to, a computer-readable medium 728. Computer-readable medium 728 may include, for example, any medium that can carry and/or make accessible data, code and/or instructions for one or more of the devices in system 700.

In one implementation, processing unit 720 may host one or more applications to initiate commands to memory controller 715 to store information in and/or retrieve information from a memory device. Such applications may comprise word processing applications, voice communication applications, navigation applications, and so on. Computing device 704 may include, for example, an input/output 732. Input/output 732 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 732 may include an operatively configured display, speaker, keyboard, mouse, trackball, touch screen, data port, etc.

In the above detailed description, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments. Embodiments described herein may include machines, devices, engines, or apparatuses that operate using digital signals. Such signals may comprise electronic signals, optical signals, electromagnetic signals, or any form of energy that provides information between locations.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
   storing a memory state represented by two or more bits in a memory cell, wherein said stored bits are characterized by two or more independent variables based, at least in part, on an amplitude or trailing edge of a write pulse;
   measuring one of said two or more independent variables after measuring another of said two or more independent variables; and
   determining said memory state based, at least in part, on the measured two or more independent variables.

2. The method of claim 1, wherein said physical properties of said memory cell comprise threshold voltage and/or low electric field resistance.

3. The method of claim 1, wherein said physical properties of said memory cell comprise high electric field resistance and/or low electric field resistance.

4. The method of claim 2, further comprising:
   reading one of said two or more independent variables by applying a first voltage or current to said memory cell; and
   reading another of said two or more independent variables by applying a second voltage or current to said memory cell.

5. The method of claim 1, further comprising:
   storing said more than one bit by applying said write pulse.

6. The method of claim 1, wherein said memory cell comprises a phase change memory (PCM) cell or a resistive random access memory (RRAM).

7. A non-volatile memory device comprising:
a memory cell array; and
a controller to:
   store a memory state represented by two or more bits in a memory cell of said memory cell array, wherein said stored bits are characterized by two or more independent variables based, at least in part, on an amplitude or trailing edge of a write pulse;
   measure one of said two or more independent variables after measuring another of said two or more independent variables; and
   determine said memory state based, at least in part, on the measured two or more independent variables.

8. The non-volatile memory of claim 7, wherein said physical properties of said memory cell comprise threshold voltage and/or low electric field resistance.

9. The non-volatile memory of claim 7, wherein said physical properties of said memory cell comprise high electric field resistance and/or low electric field resistance.

10. The non-volatile memory of claim 8, further comprising:
   reading one of said two or more independent variables by applying a first voltage or current to said memory cell; and
   reading another of said two or more independent variables by applying a second voltage or current to said memory cell.

11. The non-volatile memory of claim 7, further comprising:
   storing said more than one bit by applying said write pulse.

12. The non-volatile memory of claim 7, wherein said memory cell comprises a phase change memory (PCM) cell or a resistive random access memory (RRAM).

13. A system comprising:
a memory device including individual memory cells that store a memory state represented by two or more bits, said memory cells being writeable by a pulse comprising current amplitude and trailing edge;
a controller to:
   write said two or more bits by applying said pulses to said memory cells, wherein said two or more bits are characterized by two or more independent variables based, at least in part, on physical properties of said memory cell;
   measure one of said two or more independent variables after measuring another of said two or more independent variables; and
   determine said memory state based, at least in part, on the measured two or more independent variables; and
a processor to host one or more applications to initiate commands to said controller to write to and/or read from said memory cells.

14. The system of claim 13, wherein said physical properties of said memory cell comprise threshold voltage and/or low electric field resistance.

15. The system of claim 13, wherein said physical properties of said memory cell are based, at least in part, on amplitude and/or trailing edge of a write pulse.

16. The system of claim 13, wherein said physical properties of said memory cell comprise high electric field resistance and/or low electric field resistance.

* * * * *